US007485969B2

(12) United States Patent
Corisis et al.

(10) Patent No.: US 7,485,969 B2
(45) Date of Patent: Feb. 3, 2009

(54) STACKED MICROELECTRONIC DEVICES AND METHODS FOR MANUFACTURING MICROELECTRONIC DEVICES

(75) Inventors: David J. Corisis, Nampa, ID (US); Chin Hui Chong, Singapore (SG); Choon Kuan Lee, Singapore (SG)

(73) Assignee: Micron Technology, Inc., Boise, ID (US)

( * ) Notice: Subject to any disclaimer, the term of this patent is extended or adjusted under 35 U.S.C. 154(b) by 104 days.

(21) Appl. No.: 11/217,749

(22) Filed: Sep. 1, 2005

(65) Prior Publication Data

US 2007/0045862 A1     Mar. 1, 2007

(51) Int. Cl.
*H01L 23/52*     (2006.01)
*H01L 23/48*     (2006.01)
*H01L 23/40*     (2006.01)
*H01L 23/02*     (2006.01)
*H01L 27/146*     (2006.01)
*H01L 27/148*     (2006.01)

(52) U.S. Cl. ............... 257/777; 257/686; 257/E27.137; 257/E27.144; 257/E27.161

(58) Field of Classification Search .......... 257/777, 257/686, E27.137, E27.144, E27.161
See application file for complete search history.

(56) References Cited

U.S. PATENT DOCUMENTS

| 5,128,831 | A | 7/1992 | Fox, III et al. |
| 5,252,857 | A | 10/1993 | Kane et al. |
| 5,518,957 | A | 5/1996 | Kim |
| 5,719,449 | A | 2/1998 | Strauss |
| 5,883,426 | A | 3/1999 | Tokuno et al. |
| 5,946,553 | A | 8/1999 | Wood et al. |
| 5,986,209 | A | 11/1999 | Tandy |
| 5,990,566 | A | 11/1999 | Farnworth et al. |
| 6,020,624 | A | 2/2000 | Wood et al. |
| 6,020,629 | A | 2/2000 | Farnworth et al. |
| 6,028,365 | A | 2/2000 | Akram et al. |

(Continued)

FOREIGN PATENT DOCUMENTS

JP     11-177020 A     2/1999

(Continued)

OTHER PUBLICATIONS

Search Report and Written Opinion for Singapore Application No. 200505617-1, 17 pages, Feb. 2, 2007.

*Primary Examiner*—Luan Thai
(74) *Attorney, Agent, or Firm*—Perkins Coie LLP (57) ABSTRACT

Stacked microelectronic devices and methods for manufacturing such devices. An embodiment of a microelectronic device can include a support member and a first known good microelectronic die attached to the support member. The first die includes an active side, a back side, a first terminal, and integrated circuitry electrically coupled to the first terminal. The first die also includes a first redistribution structure at the active side. The microelectronic device can also include a second known good microelectronic die attached to the first die in a stacked configuration with a back side of the second die facing the support member and an active side of the second die facing away from the support member. The second die includes a second redistribution structure at the active side. The device can further include a casing covering the first die, the second die, and at least a portion of the support member.

41 Claims, 8 Drawing Sheets

U.S. PATENT DOCUMENTS

| | | | |
|---|---|---|---|
| 6,051,878 | A | 4/2000 | Akram et al. |
| 6,072,233 | A | 6/2000 | Corisis et al. |
| 6,072,236 | A | 6/2000 | Akram et al. |
| 6,133,626 | A | 10/2000 | Hawke et al. |
| 6,169,329 | B1 | 1/2001 | Farnworth |
| 6,175,149 | B1 | 1/2001 | Akram |
| 6,212,767 | B1 | 4/2001 | Tandy |
| 6,225,689 | B1 | 5/2001 | Moden et al. |
| 6,235,554 | B1 | 5/2001 | Akram et al. |
| 6,258,623 | B1 | 7/2001 | Moden et al. |
| 6,281,577 | B1 | 8/2001 | Oppermann et al. |
| 6,294,839 | B1 | 9/2001 | Mess et al. |
| 6,297,547 | B1 | 10/2001 | Akram |
| 6,303,981 | B1 | 10/2001 | Moden |
| 6,429,528 | B1 | 8/2002 | King et al. |
| 6,511,901 | B1 | 1/2003 | Lam et al. |
| 6,548,376 | B2 | 4/2003 | Jiang |
| 6,552,910 | B1 | 4/2003 | Moon et al. |
| 6,560,117 | B2 | 5/2003 | Moon |
| 6,607,937 | B1 | 8/2003 | Corisis |
| 7,145,228 | B2 * | 12/2006 | Yean et al. .................. 257/698 |
| 7,247,934 | B2 * | 7/2007 | Pu .............................. 257/686 |
| 2003/0109079 | A1 | 6/2003 | Yamaguchi et al. |
| 2004/0104473 | A1 | 6/2004 | Farnworth |
| 2004/0262734 | A1 | 12/2004 | Yoo |
| 2005/0040529 | A1 * | 2/2005 | Lee ........................... 257/738 |
| 2005/0104184 | A1 | 5/2005 | Ahn et al. |

FOREIGN PATENT DOCUMENTS

| | | | |
|---|---|---|---|
| WO | WO-02/09181 | A1 | 1/2002 |

* cited by examiner

STACKED MICROELECTRONIC DEVICES AND METHODS FOR MANUFACTURING MICROELECTRONIC DEVICES

TECHNICAL FIELD

The present invention is related to stacked microelectronic devices and methods for manufacturing microelectronic devices.

BACKGROUND

Microelectronic devices generally have a die (i.e., a chip) that includes integrated circuitry having a high density of very small components. In a typical process, a large number of dies are manufactured on a single wafer using many different processes that may be repeated at various stages (e.g., implanting, doping, photolithography, chemical vapor deposition, plasma vapor deposition, plating, planarizing, etching, etc.). The dies typically include an array of very small bond-pads electrically coupled to the integrated circuitry. The bond-pads are the external electrical contacts on the die through which the supply voltage, signals, etc., are transmitted to and from the integrated circuitry. The dies are then separated from one another (i.e., singulated) by dicing the wafer and backgrinding the individual dies. After the dies have been singulated, they are typically "packaged" to couple the bond-pads to a larger array of electrical terminals that can be more easily coupled to the various power supply lines, signal lines, and ground lines.

Figure 1A:
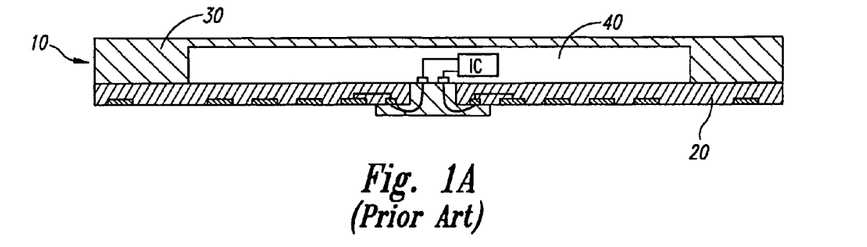
FIG. 1A is a partially schematic side cross-sectional view of a conventional packaged microelectronic device in accordance with the prior art.

An individual die can be packaged by electrically coupling the bond-pads on the die to arrays of pins, ball-pads, or other types of electrical terminals, and then encapsulating the die to protect it from environmental factors (e.g., moisture, particulates, static electricity, and physical impact). In one application, the bond-pads are electrically connected to contacts on an interposer substrate that has an array of ball-pads. FIG. 1A schematically illustrates a conventional packaged microelectronic device 10 including an interposer substrate 20 and a microelectronic die 40 attached to the interposer substrate 20. The microelectronic die 40 has been encapsulated with a casing 30 to protect the die 40 from environmental factors.

Electronic products require packaged microelectronic devices to have an extremely high density of components in a very limited space. For example, the space available for memory devices, processors, displays, and other microelectronic components is quite limited in cell phones, PDAs, portable computers, and many other products. As such, there is a strong drive to reduce the surface area or "footprint" of the microelectronic device 10 on a printed circuit board. Reducing the size of the microelectronic device 10 is difficult because high performance microelectronic devices 10 generally have more bond-pads, which result in larger ball-grid arrays and thus larger footprints. One technique used to increase the density of microelectronic devices 10 within a given footprint is to stack one microelectronic device 10 on top of another.

Figure 1B:
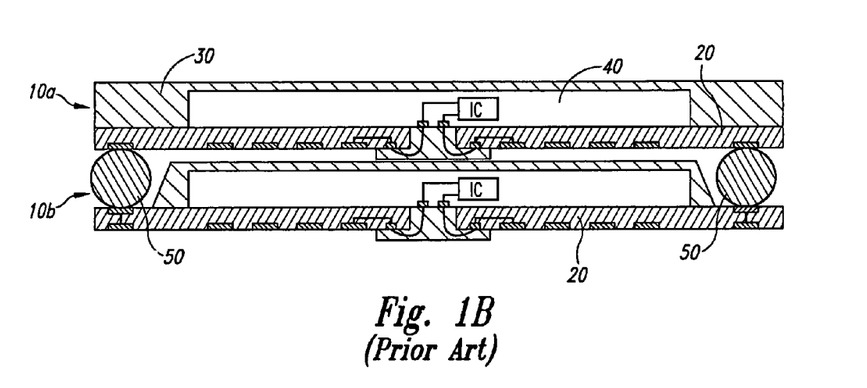
FIG. 1B is a partially schematic side cross-sectional view of the packaged microelectronic device of FIG. 1A stacked on top of a second similar microelectronic device.

FIG. 1B schematically illustrates the packaged microelectronic device (identified as 10*a*) of FIG. 1A attached to a second similar microelectronic device 10*b* in a stacked configuration. The interposer substrate 20 of the first microelectronic device 10*a* is coupled to the interposer substrate 20 of the second microelectronic device 10*b* by large solder balls 50. One drawback of the stacked devices 10*a-b* is that the large solder balls 50 required to span the distance between the two interposer substrates 20 use valuable space on the interposer substrates 20, which increases the footprint of the microelectronic devices 10*a-b*.

Figure 2:
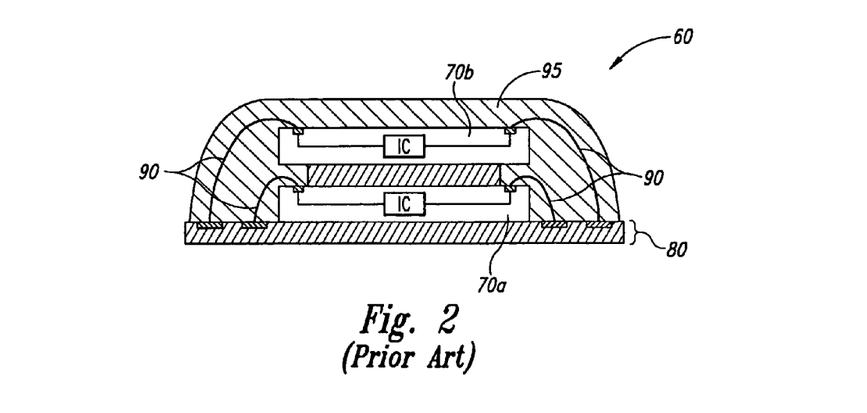
FIG. 2 is a partially schematic side cross-sectional view of another packaged microelectronic device in accordance with the prior art.

FIG. 2 schematically illustrates another packaged microelectronic device 60 in accordance with the prior art. The device 60 includes a first microelectronic die 70*a* attached to a substrate 80 and a second microelectronic die 70*b* attached to the first die 70*a*. The first and second dies 70*a-b* are electrically coupled to the substrate 80 with a plurality of wire-bonds 90. The device further includes a casing 95 encapsulating the dies 70*a-b* and wire-bonds 90. One drawback of the packaged microelectronic device 60 illustrated in FIG. 2 is that if one of the dies 70*a-b* fails a post-encapsulation quality control test because it is not properly wire bonded to the substrate 80 or for some other reason, the packaged device 60, including the good die 70, is typically discarded. If one of the dies 70*a-b* becomes inoperable and/or damaged after packaging, the entire packaged device 60 (rather than just the bad die) is generally discarded. Accordingly, there is a need to improve the processes for packaging microelectronic devices.

DETAILED DESCRIPTION

A. Overview/Summary

The following disclosure describes several embodiments of stacked microelectronic devices and methods for manufacturing microelectronic devices. One aspect of the invention is directed toward packaged microelectronic devices. An embodiment of one such microelectronic device can include a support member having support member circuitry and a first known good microelectronic die attached to the support member. The first die includes an active side, a back side opposite the active side, a first terminal at the active side, and integrated circuitry electrically coupled to the first terminal. The first die also includes a first redistribution structure at the active side of the first die and electrically coupled to the first terminal at the active side of the first die and the support member circuitry. The microelectronic device can also include a second known good microelectronic die attached to the first die in a stacked configuration such that a back side of the second die is facing the support member and an active side of the second die faces away from the support member. The second die includes a second terminal at the active side and integrated circuitry electrically coupled to the second terminal of the second die. The second die also includes a second redistribution structure at the active side of the second die and electrically coupled to the second terminal and the support member circuitry, and a plurality of electrical couplers attached to the second redistribution structure. The device can further include a casing covering the first die, the second die, and at least a portion of the support member.

Another embodiment is directed toward a microelectronic device including an interposing structure and a first known good microelectronic die attached and electrically coupled to the interposing structure in a flip-chip configuration. The first die includes an active side, a back side opposite the active side, and a first redistribution structure at the active side. The device also includes a second known good microelectronic die having an active side including a second redistribution structure and a back side opposite the active side. The back side of the second die is attached to the back side of the first die such that the second redistribution structure is facing away from the support member. The second redistribution structure is electrically coupled to the interposing structure. The device can also include an encapsulant at least partially encapsulating the first die, the second die, and at least a portion of the support member.

Another aspect of the invention is directed toward methods for packaging microelectronic devices. One embodiment of such a method includes attaching a first known good microelectronic die to a support member having support member circuitry. The first die includes a first redistribution structure electrically coupled to the support member circuitry. The method also includes attaching a second known good microelectronic die to the first die with the first die between the second die and the support member. The second die includes a second redistribution structure facing away from the support member. The method further includes electrically coupling the second die to the support member and encapsulating at least a portion of the first die, the second die, and the support member.

The terms "assembly" and "subassembly" are used throughout to include a variety of articles of manufacture, including, e.g., semiconductor wafers having active components, individual integrated circuit dies, packaged dies, and subassemblies comprising two or more microfeature workpieces or components, e.g., a stacked die package. Many specific details of certain embodiments of the invention are set forth in the following description and in FIGS. 3A-8 to provide a thorough understanding of these embodiments. A person skilled in the art, however, will understand that the invention may be practiced without several of these details or additional details can be added to the invention. Well-known structures and functions have not been shown or described in detail to avoid unnecessarily obscuring the description of the embodiments of the invention. Where the context permits, singular or plural terms may also include plural or singular terms, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the term "comprising" is used throughout to mean including at least the recited feature(s) such that any greater number of the same feature and/or additional types of features are not precluded.

B. Microelectronic Dies Including Redistribution Structures

Figure 3A:
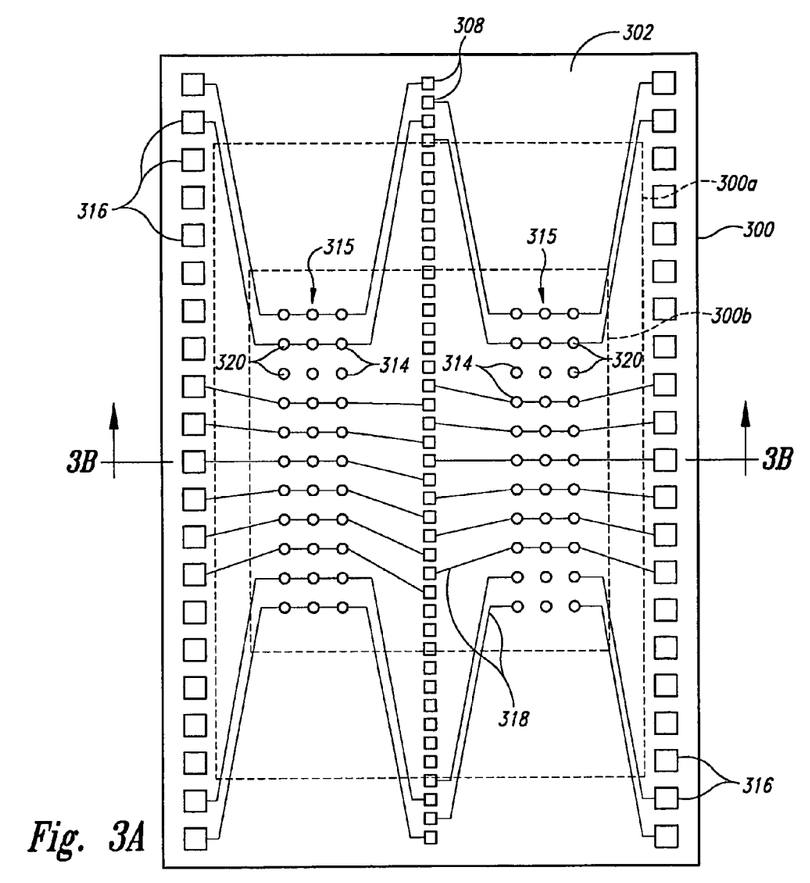
FIG. 3A is a partially schematic top plan view of a microelectronic die including a redistribution structure before being packaged in accordance with several embodiments of the invention.
Figure 3B:
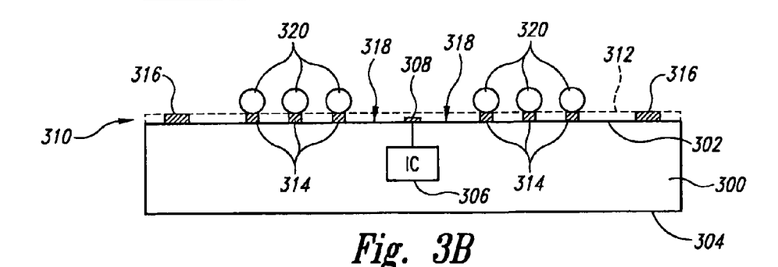
FIG. 3B is a partially schematic side cross-sectional view of the die and redistribution structure of FIG. 3A.

FIGS. 3A and 3B illustrate a microelectronic die 300 at an intermediate processing stage before the die 300 has been packaged in accordance with several embodiments of the invention. More specifically, FIG. 3A is a top plan view of the die 300, and FIG. 3B is a side cross-sectional view taken substantially along line 3B-3B of FIG. 3A. Referring to FIGS. 3A and 3B together, the die 300 includes an active side 302, a back side 304 opposite the active side 302, and integrated circuitry 306 (shown schematically). The die 300 can include a memory device, a processor, or another type of device that includes integrated circuitry. The die 300 includes a plurality of terminals 308 (e.g., bond-pads) arranged in an array at the active side 302 of the die 300 and electrically coupled to the integrated circuitry 306. The bond-pads 308 accordingly provide external contacts to provide source voltages, ground voltages, and signals to the integrated circuitry 306 in the die 300. The bond-pads 308, however, are typically so small that they cannot be attached directly to contacts on printed circuit boards or other modules in a cost-effective manner. The die 300 accordingly includes a redistribution structure 310 at the active side 302 of the die 300 to redistribute the signals from the bond-pads 308 to a larger array of contacts.

The redistribution structure 310, for example, can include one or more dielectric layers 312 (FIG. 3B—shown partially schematically in broken lines) a plurality of ball-pads 314 arranged in ball-pad arrays 315, a plurality of peripheral contacts 316 at or proximate to a perimeter portion of the die 300, and traces 318 or other conductive lines coupling the bond-pads 308 to corresponding ball-pads 314 and/or peripheral contacts 316 (only a portion of the traces 318 are shown). A number of electrical couplers 320 (e.g., solder bumps or solder balls) can be attached to the ball-pads 314. The ball-pads 314 and corresponding electrical couplers 320 provide (a) contacts for testing the die 300, and (b) contacts for attaching and electrically coupling the die 300 to another device (e.g., using a flip-chip (FCIP) configuration). The peripheral contacts 316 can be used to electrically couple the die 300 to another device (e.g., using a chip-on-board (COB) configuration) with a plurality of wire bonds or other types of connectors extending between the peripheral contacts 316 and corresponding contacts on a support member (not shown) attached to the die 300. The peripheral contacts 316 can also provide additional contact points for testing the die 300. The redistribution structure 310 accordingly provides arrays of ball-pads 314 and/or peripheral contacts 316 that are spaced farther apart and have more surface area than the bond-pads 308 for attaching and electrically coupling the die 300 to a printed circuit board, a flip-chip in package, or other applications. In several embodiments, the redistribution structure 310 can also include one or more dielectric layers (not shown) over the die 300 and at least a portion of the components of the redistribution structure 310 (e.g., the traces 318).

In one aspect of this embodiment, the ball-pad arrays 315 are arranged on the die 300 in a predetermined pattern such that the ball-pad array 315 maintains a constant configuration and spacing (i.e., pitch and pattern) for each generation of increasingly smaller dies. More specifically, the size and locations of the ball-pads 314 in the ball-pad arrays 315 remain constant from the current generation of the die 300 to subsequent generations of smaller dies 300a and 300b (shown in broken lines in FIG. 3A). One advantage of this feature is that equipment for processing (e.g., testing, packaging, etc.) the dies will not need to be reconfigured each time a newer generation of die is produced. For example, the universal ball-pad array 315 between the various generations of dies will provide a common set of contacts for testing each new generation of dies. This feature can accordingly decrease the cost of processing the dies, as well as increasing the throughput of processed dies.

Another feature of the redistribution structure 310 on the die 300 is that the pattern of contacts is "mirrored" between the left-hand and right-hand sides of the die 300. Referring to FIG. 3A, for example, the arrangement of contacts (e.g., ball-pads 314 in the ball-pad array 315 and peripheral contacts 316) is the same on either side (i.e., the left side and the right side) of the array of bond-pads 308 that extends longitudinally along a medial portion of the die 300. One advantage of this feature is that the mirrored configuration can facilitate pin matching for FCIP packaging and stacking processes.

In the embodiment illustrated in FIGS. 3A and 3B, the packaging of the die 300 has not been completed. As described below with reference to FIGS. 4A-8, additional processing can be carried out to package and/or configure a plurality of microelectronic dies (e.g., such as one or more of the dies 300) for use in microelectronic devices or products.

Figures 4A, 4B:
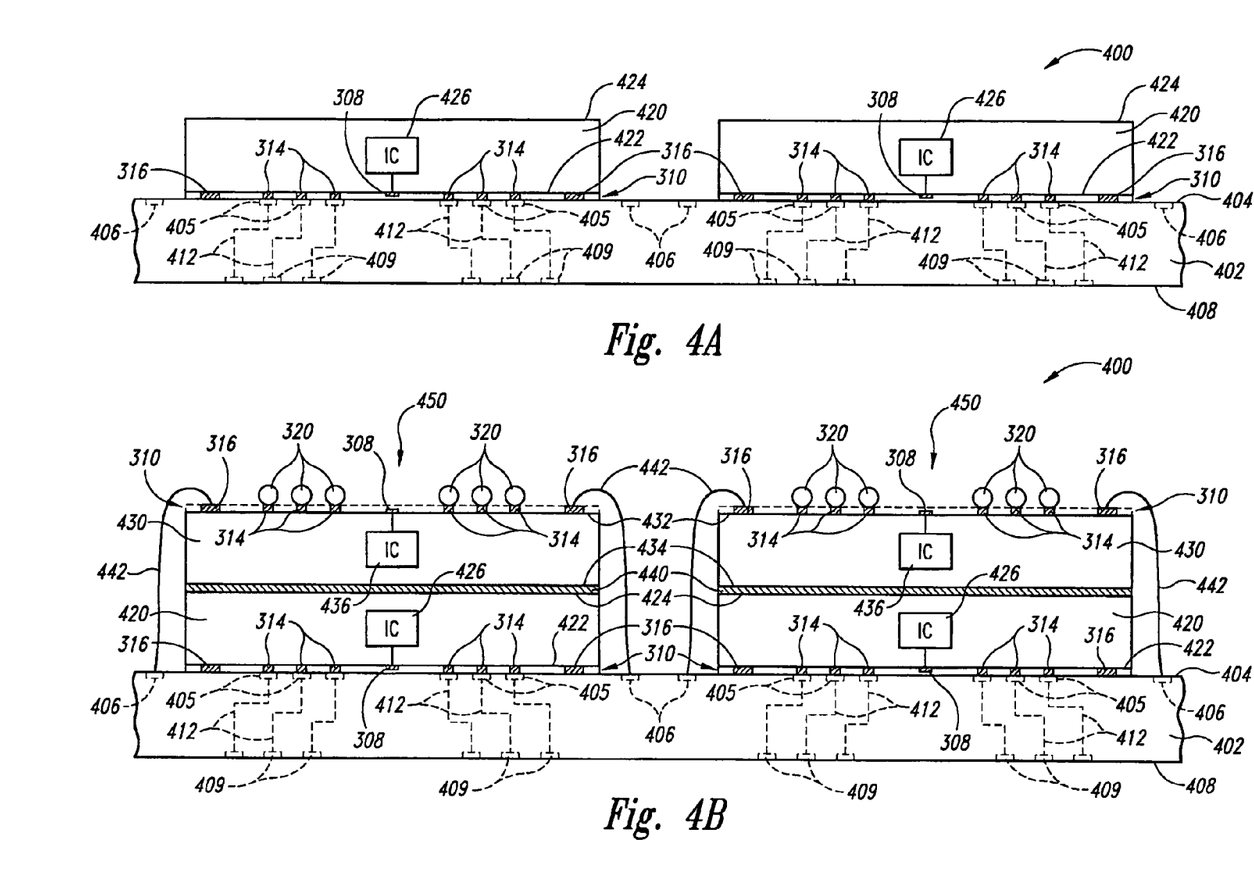
FIGS. 4A-4D illustrate stages of a method for manufacturing a plurality of microelectronic devices in accordance with an embodiment of the invention.

C. Embodiments of Methods for Manufacturing Stacked Microelectronic Devices and Microelectronic Devices Formed Using Such Methods FIGS. 4A-6 illustrate stages in a method for manufacturing a plurality of stacked microelectronic devices and microelectronic devices formed using such a method. FIG. 4A, for example, is a schematic side cross-sectional view of an assembly 400 including a plurality of first known good microelectronic dies 420 (only two are shown) attached to a support member 402. The support member 402 can include an interposer substrate, a printed circuit board, or other support member for carrying the first dies 420. In the illustrated embodiment, the support member 402 includes (a) a first side 404 having a plurality of first contacts 405 and a plurality of second contacts 406, (b) a second side 408 opposite the first side 404 and having a plurality of pads 409, and (c) a plurality of traces 412 or other type of conductive lines between the first and/or second contacts 405 and 406 and corresponding pads 409 or other contacts (not shown) at the second side 408 of the support member 402. The first and second contacts 405 and 406 can be arranged in arrays for electrical connection to corresponding contacts on the first dies 420 and one or more dies stacked on the first dies 420, as described in more detail below. In one aspect of this embodiment, the pads 409 at the second side 408 of the support member 402 are arranged in an array corresponding to a standard JEDEC pinout. In other embodiments, such as the embodiment described below with respect to FIG. 5, the array of pads 409 can have other arrangements.

The first dies 420 can be generally similar to the die 300 described above with respect to FIGS. 3A and 3B. For example, the individual first dies 420 can include an active side 422, a back side 424 opposite the active side 422, and integrated circuitry 426. The individual first dies 420 can further include the redistribution structure 310 at the active side 422 of the first dies 420. In the illustrated embodiment, the active sides 422 of the individual first dies 420 are attached to the first side 404 of the support member 402 in a FCIP configuration. More specifically, the ball-pads 314 and corresponding conductive bumps or balls (not shown) of the redistribution structure 310 are attached and electrically coupled to corresponding first contacts 405 at the first side 404 of the support member 402. In other embodiments, such as the embodiment described below with respect to FIG. 8, the first dies 420 can be attached to the support member 402 in a different arrangement. Although the illustrated first dies 420 have the same configuration, in other embodiments the first dies 420 may have different features to perform different functions. In another aspect of this embodiment, the first dies 420 (and the second dies described below with respect to FIG. 4B) can be individually tested and burned-in to ensure that they function properly before further processing so that only known good dies are packaged.

Referring next to FIG. 4B, one or more second known good microelectronic dies 430 are stacked on corresponding first dies 420 to form individual stacked subassemblies or stacked units 450. The individual second dies 430 can also be generally similar to the die 300 described above with respect to FIGS. 3A and 3B. The individual second dies 430, for example, can include an active side 432, a back side 434 opposite the active side 432, and integrated circuitry 436. The second dies 430 can also include the redistribution structure 310 at the active side 432 of the second dies 430. The back sides 434 of the second dies 430 can be attached to the back sides 424 of corresponding first dies 420 using an adhesive 440, such as an adhesive film, epoxy, tape, paste, or other suitable material.

After attaching the second dies 430 to corresponding first dies 420, the second dies 430 can be electrically coupled to the support member 402. In the illustrated embodiment, for example, a plurality of wire-bonds 442 or other types of connectors are formed between the peripheral contacts 316 on the second dies 430 and corresponding second contacts 406 on the support member 402. Accordingly, the second dies 430 are not directly electrically coupled to the first dies 420. Although the second dies 430 are generally similar to the first dies 420, in other embodiments the second dies 430 can have a different configuration and/or include different features.

Figure 4C:
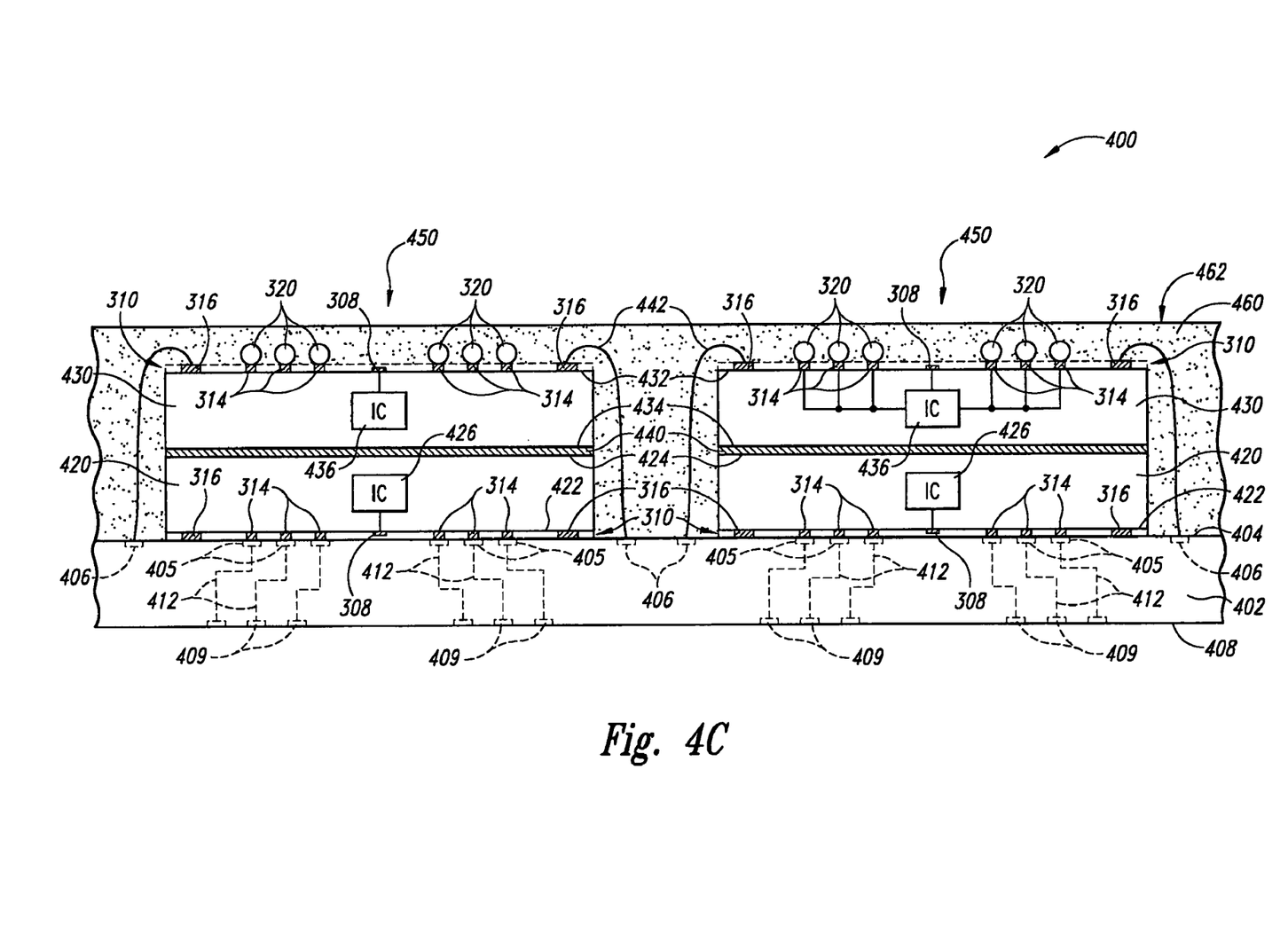

Referring next to FIG. 4C, an encapsulant 460 is deposited onto the support member 402 to form a plurality of casings 462 at least partially encapsulating the stacked subassemblies 450. The encapsulant 460 can be deposited onto the support member 402 using a suitable application process, such as conventional injection molding, film molding, or another suitable process.

Figure 4D:
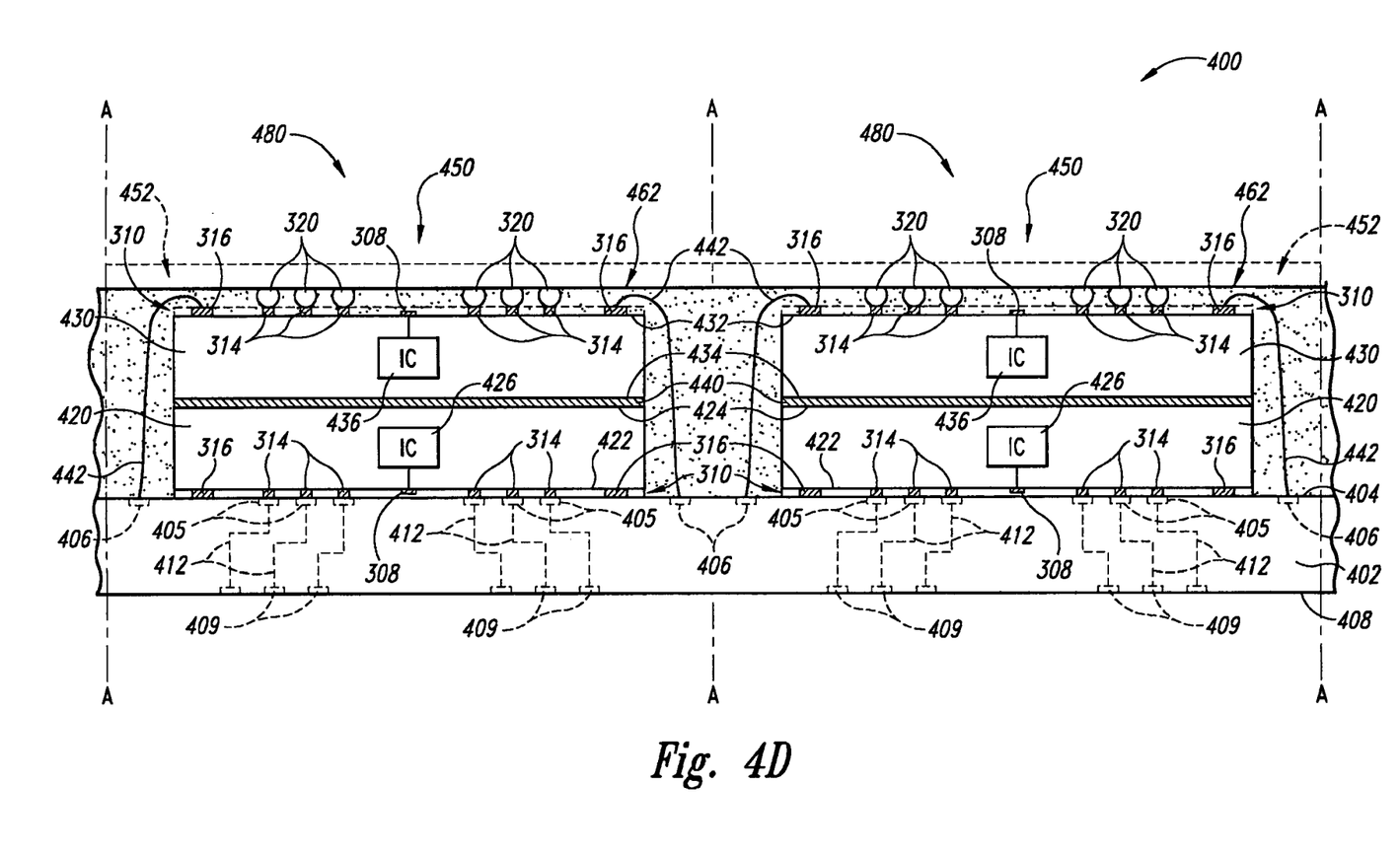

Referring next to FIG. 4D, a top portion 452 of the stacked subassemblies 450 (shown in broken lines) can be removed to at least partially expose the electrical couplers 320 on the ball-pads 314 at the active sides 432 of the second dies 430. The top portion 452 of the stacked subassemblies 450 can be removed using a grinding process or another suitable process. In other embodiments, the casing 462 at the top portion 452 of the stacked subassemblies 450 may be thin enough that the electrical couplers 320 are at least partially exposed after encapsulation and, therefore, a grinding or removal process is not necessary. For example, the encapsulant 460 can be deposited using a film molding process that leaves a portion of the electrical couplers 320 exposed after the device is removed from the mold. After at least partially exposing the electrical couplers 320 on the second dies 430, a plurality of electrical couplers 470 (e.g., solder balls) can be attached to corresponding pads 409 at the second side 408 of the support member 402, and the assembly 400 can be cut along lines A-A to singulate a plurality of individual stacked microelectronic devices 480.

One feature of the microelectronic devices 480 is that both the first and second dies 420 and 430 can be tested to ensure that they function properly before being assembled together. An advantage of this feature is that each of the microelectronic devices 480 formed using the methods described above includes only known good dies. Defective dies can be detected and excluded from the assembly 400. Throughput of microelectronic devices 480 can accordingly be increased because the microelectronic devices 480 will generally include only known good devices. This increases the yield of the packaging processes described above with respect to FIGS. 4A-4D and reduces the number of devices that malfunction and/or include defects.

Figure 5:
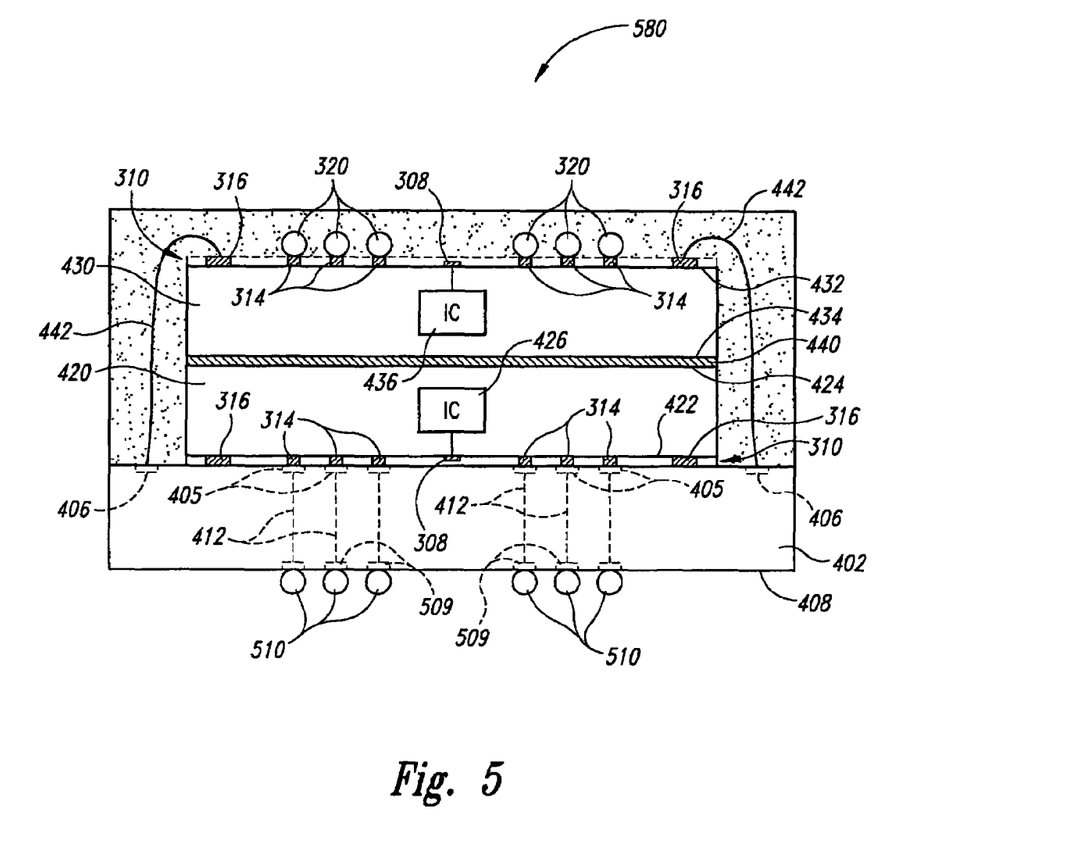
FIG. 5 is a partially schematic side cross-sectional view of a microelectronic device in accordance with another embodiment of the invention.

FIG. 5 is a side cross-sectional view of a microelectronic device 580 configured in accordance with another embodiment of the invention. The device 580 can be formed using methods generally similar to the methods used to form the devices 480 described above with respect to FIGS. 4A-4D, and the device 580 can include several features generally similar to the individual devices 480. Accordingly, like reference numbers are used to refer to like components in FIGS. 4A-4D and FIG. 5. The device 580 differs from the individual devices 480 described above with respect to FIG. 4D in that the device 580 includes an array of pads 509 at the second side 408 of the support member 402 having a different arrangement than the array of pads 409 of the devices 480. More specifically, the devices 480 are configured to be a "bottom" or "lower" device in a stacked microelectronic device and, accordingly, the pads 409 are arranged to have a standard JEDEC pinout. On the other hand, the device 580 is configured to be an "upper" device (i.e., a device stacked on the lower device 480) and, accordingly, the pads 509 are arranged in an array corresponding at least in part to the arrangement of ball-pads 314 of the redistribution structure 310 on the second dies 430 of the devices 480. The device 580 can further include a plurality of electrical couplers 510 (e.g., solder balls or conductive bumps) attached to corresponding pads 509.

Figure 6:
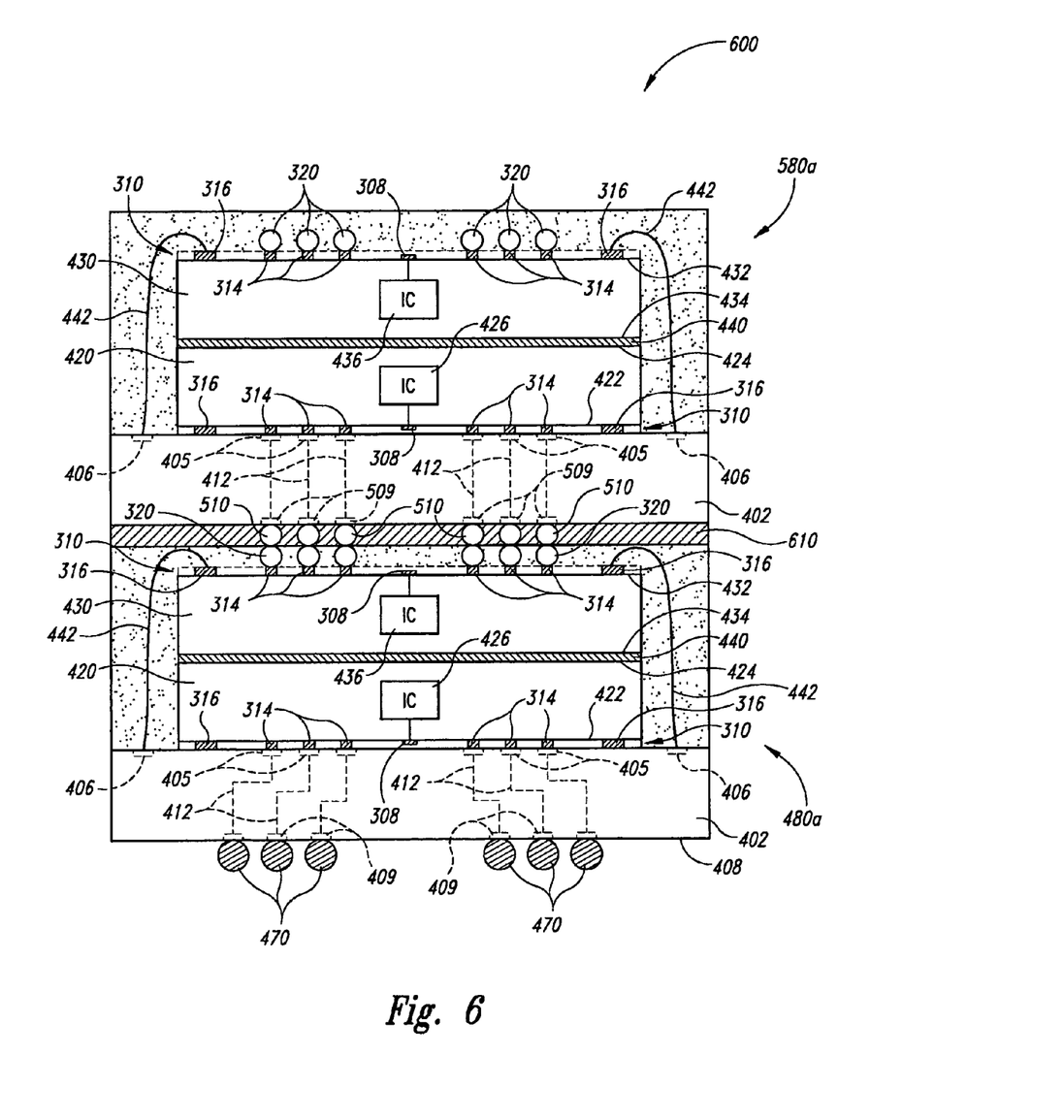
FIG. 6 is a partially schematic side cross-sectional view of an upper microelectronic device stacked on top of a lower microelectronic device.

In several embodiments, one or more microelectronic devices 580 can be stacked on the individual microelectronic devices 480 to form stacked microelectronic devices. FIG. 6, for example, is a side cross-sectional view of a stacked microelectronic device 600 including an upper microelectronic device 580a stacked on top of a lower microelectronic device 480a. The upper and lower devices 580a and 480a can be generally similar to the microelectronic devices 480 and 580 described above with respect to FIGS. 4D and 5. The upper device 580a is coupled to the lower device 480a by attaching the electrical couplers 510 of the upper device 580a to the electrical couplers 320 on the second die 430 of the lower device 480a. In other embodiments, additional microelectronic devices can be stacked onto the upper microelectronic device 580a by exposing the electrical couplers 320 at the active side 432 of the second die 430 in the upper device 580a and stacking one or more additional devices (not shown) onto the upper device 580a, or the electrical couplers 320 on the second die 430 may be eliminated when no additional devices are to be stacked on the second die 430. In additional embodiments, the microelectronic devices 480 and 580 can be stacked before the assembly 400 (FIG. 4D) is cut and the devices 480 are singulated. For example, a plurality of singulated devices 580 can be attached to corresponding devices 480 in the assembly 400 illustrated in FIG. 4D.

In several embodiments, a fill material 610 can be deposited into the area between the upper device 580a and the lower device 480a. The fill material 610 can enhance the integrity of the stacked device 600 and protect the components of the upper device 580a and the lower device 480a from moisture, chemicals, and other contaminants. In one embodiment, the fill material 610 can include a molding compound such as an epoxy resin. In other embodiments, the fill material 610 can include other suitable materials. Depositing the fill material 610 is an optional step that may not be included in some embodiments.

One advantage of the microelectronic devices 480 and 580 described above with reference to FIGS. 4D-6 is that the devices 480 and 580 can be stacked on top of each other. Stacking microelectronic devices increases the capacity and/or performance within a given surface area or footprint. For example, when the upper microelectronic device 580a is stacked on top of the lower microelectronic device 480a and the lower device 480a is attached to a circuit board, the upper microelectronic device 580a is electrically and operably coupled to the circuit board without using significantly more surface area on the circuit board.

Another feature of the microelectronic devices 480 and 580 described above with reference to FIGS. 4D-6 is that the electrical couplers 470 and 510, respectively, are positioned inboard of the first and second dies 420 and 430 in the devices 480 and 580. An advantage of this feature is that the footprint of the stacked device 600 is reduced as compared with conventional stacked devices, such as the devices 10a and 10b illustrated in FIG. 1B where the solder balls 50 are outboard of the dies 40. Minimizing the footprint of microelectronic devices is particularly important in cell phones, PDAs, and other electronic products where there is a constant drive to reduce the size of microelectronic components used in such devices.

Still another feature of the microelectronic devices 480 and 580 described above is that the individual devices 480 and 580 can be tested after packaging and before stacking. An advantage of this feature is that defective packaged devices can be detected and excluded from a stack of devices. Therefore, stacks of microelectronic devices can include only known good devices, which increases the yield of the device stacks and reduces the number of devices that are discarded.

D. Additional Embodiments of Stacked Microelectronic Devices

Figure 7:
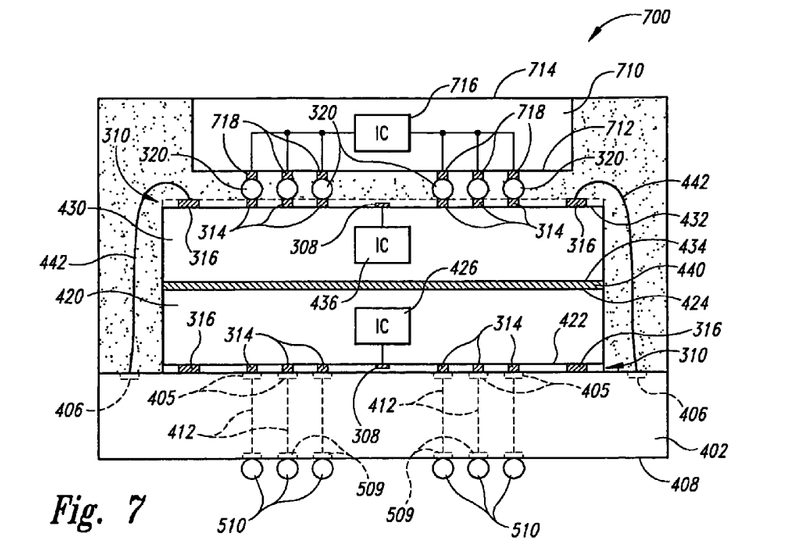
FIG. 7 is a partially schematic side cross-sectional view of a microelectronic device in accordance with yet another embodiment of the invention.
Figure 8:
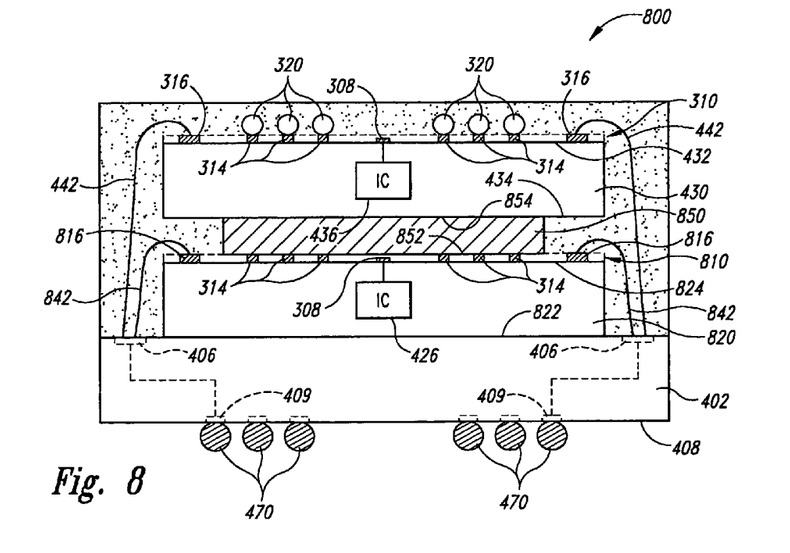
FIG. 8 is a partially schematic side cross-sectional view of a microelectronic device in accordance with still another embodiment of the invention.

FIGS. 7 and 8 illustrate stacked microelectronic devices in accordance with additional embodiments of the invention. These devices can include several features generally similar to the devices 480 and 580 described above with respect to FIGS. 4D-6. Accordingly, like reference numbers are used to refer to like components in FIGS. 4D-6 and FIGS. 7 and 8. The devices described below can also have many of the same advantages as the devices 480 and 580 described above with respect to FIGS. 4D-6.

FIG. 7, for example, is a side cross-sectional view of a microelectronic device 700. The device 700 can be generally similar to the device 480 described above with respect to FIG. 4D. The device 700 differs from the device 480, however, in that the device 700 includes one or more additional dies attached to the second die 430 in a stacked configuration. More specifically, the device 700 includes a third die 710 (e.g., an ASICs device) attached to the active side 432 of the second die 430. The third die 710 can include an active side 712 and a back side 714 opposite the active side 712. The active side 712 is attached to the second die 430. The third die 710 can further include integrated circuitry 716 and a plurality of external contacts 718 at the active side 712 and electrically coupled to corresponding electrical couplers 320 on the second die 430.

FIG. 8 is a partially schematic side cross-sectional view of a microelectronic device 800 in accordance with still another embodiment of the invention. The device 800 can include several features generally similar to the devices 480/580/700 described above with respect to FIGS. 4D, 5, and 7, respectively. The arrangement of the first die in the device 800, however, differs from the arrangement of the first die 420 in the devices 480/480/700. More specifically, the device 800 includes a first die 820 having a COB configuration rather than the FCIP configuration of the first die 420 in the devices 480/580/700 described above. The device 800 further includes the second die 430 on the first die 820 in a stacked configuration.

The first die 820 of the device 800 can include an active side 822 facing away from the support member 402 and a back side 824 attached to the support member 402. The first side 820 further includes a redistribution structure 810 at the active side 822. The redistribution structure 810 can be generally similar to the redistribution structure 310 described previously. The redistribution structure 810, for example, can include first peripheral contacts 816 proximate to a perimeter portion of the first die 820 and electrically coupled to corresponding contacts 406 on the support member 402 using first wire-bonds 842 or other suitable connectors. The second peripheral contacts 316 on the second die 430 can also be electrically coupled to the first contacts 406 using second wire-bonds 442 or other suitable connectors.

The device 800 further includes a stand-off 850 between the first die 820 and the second die 430. The stand-off 850 can include a first side 852 in contact with the active side 822 of the first die 820 and a second side 854 in contact with the back side 434 of the second die 430. The stand-off 850 can be attached to the first die 820 and second die 430 with a suitable adhesive material (not shown). The stand-off 850 is sized to space the second die 430 apart from the first die 820 so that the first wire-bonds 842 can extend between the first peripheral contacts 316 on the first die 820 and corresponding contacts 406 on the support member 402. The stand-off 850 can be tape or another suitable device.

From the foregoing, it will be appreciated that specific embodiments of the invention have been described herein for purposes of illustration, but that various modifications may be made without deviating from the invention. For example, one or more additional devices may be stacked on the devices in each of the embodiments described above to form stacked devices having three or more stacked units. Furthermore, the devices described above may have different arrangements and/or include different features. Aspects of the invention described in the context of particular embodiments may be combined or eliminated in other embodiments. Further, while advantages associated with certain embodiments of the invention have been described in the context of those embodiments, other embodiments may also exhibit such advantages, and not all embodiments need necessarily exhibit such advantages to fall within the scope of the invention. Accordingly, the invention is not limited except as by the appended claims.

I/We claim:

1. A packaged microelectronic device, comprising:
 a support member having support member circuitry including a first side, a second side opposite the first side, a plurality of first support member contacts and a plurality of second support member contacts at the first side, and a plurality of support member pads at the second side;
 a first known good microelectronic die attached to the support member, the first die including an active side and a back side opposite the active side, a first terminal at the active side, integrated circuitry electrically coupled to the first terminal, and a first redistribution structure at the active side of the first die and electrically coupled to the first terminal and the support member circuitry, wherein the first redistribution structure redistributes the signals from the first terminal to a larger array of first contacts;
 a second known good microelectronic die having an active side and a back side opposite the active side, wherein the second die is attached to the first die in a stacked configuration such that the back side of the second die is facing the support member, the second die including a second terminal at the active side, integrated circuitry electrically coupled to the second terminal, a second redistribution structure at the active side of the second die and electrically coupled to the second terminal and the support member circuitry, and a plurality of electrical couplers attached to the second redistribution structure, wherein the second redistribution structure redistributes the signals from the second terminal to a larger array of second contacts; and
 a casing covering the first die, the second die, and at least a portion of the support member.

2. The packaged microelectronic device of claim 1 wherein:
 the active side of the first die is adjacent to the first side of the support member and the first redistribution structure is electrically coupled to the first support member contacts; and
 the second redistribution structure is electrically coupled to the second support member contacts.

3. The packaged microelectronic device of claim 1 wherein: the active side of the first die is adjacent to the first side of the support member;
 the first redistribution structure includes a plurality of first ball-pads arranged in a first ball-pad array, a plurality of first peripheral contacts at a perimeter portion of the first die, and traces coupling the first terminals to corresponding first ball-pads and/or first peripheral contacts, wherein the first ball-pads are electrically coupled to corresponding first support member contacts; and
 the second redistribution structure includes a plurality of second ball-pads arranged in a second ball-pad array, a plurality of second peripheral contacts at a perimeter portion of the second die, and traces coupling the second terminals to corresponding second ball-pads and/or second peripheral contacts, wherein the second peripheral contacts are wire-bonded to corresponding second support member con tacts.

4. The packaged microelectronic device of claim 1 wherein:
 the back side of the first die is adjacent to the first side of the support member and the first redistribution structure is electrically coupled to the first support member contacts;
 the second redistribution structure is electrically coupled to the second support member contacts; and
 the microelectronic device further comprises a stand-off between the first die and the second die, wherein the first die and second die are attached to the stand-off.

5. The packaged microelectronic device of claim 1 wherein:
 the back side of the first die is adjacent to the first side of the support member;
 the first redistribution structure includes a plurality of first ball-pads arranged in a first ball-pad array, a plurality of first peripheral contacts at a perimeter portion of the first die, and traces coupling the first terminals to corresponding first ball-pads and/or first peripheral contacts, wherein the first peripheral contacts are wire-bonded to corresponding first support member contacts;

the second redistribution structure includes a plurality of second ball-pads arranged in a second ball-pad array, a plurality of second peripheral contacts at a perimeter portion of the second die, and traces coupling the second terminals to corresponding second ball-pads and/or second peripheral contacts, wherein the second peripheral contacts are wire-bonded to corresponding first support member contacts; and the microelectronic device further comprises a stand-off between the first die and the second die, wherein the first die and second die are attached to the stand-off.

6. A packaged microelectronic device, comprising:

a support member having support member circuitry including a first side, a second side opposite the first side, a plurality of first support member contacts at the first side, and a plurality of support member pads at the second side;

a first known good microelectronic die attached to the support member, the first die including an active side and a back side opposite the active side, a first terminal at the active side, integrated circuitry electrically coupled to the first terminal, and a first redistribution structure at the active side of the first die and electrically coupled to the first terminal and the support member circuitry, wherein the first redistribution structure redistributes the signals from the first terminal to a larger array of first contacts;

a second known good microelectronic die having an active side and a back side opposite the active side, wherein the second die is attached to the first die in a stacked configuration such that the back side of the second die is facing the support member, the second die including a second terminal at the active side, integrated circuitry electrically coupled to the second terminal, a second redistribution structure at the active side of the second die and electrically coupled to the second terminal and the support member circuitry, and a plurality of electrical couplers attached to the second redistribution structure, wherein the second redistribution structure redistributes the signals from the second terminal to a larger array of second contacts; and a casing covering the first die, the second die, and at least a portion of the support member.

7. The microelectronic device of claim 6 wherein the plurality of support member pads at the second side includes an array of support member pads arranged in a pattern corresponding to a JEDEC pinout.

8. The microelectronic device of claim 6 wherein:

the second redistribution structure includes a plurality of second ball-pads arranged in a second ball-pad array, and wherein the plurality of electrical couplers are attached to corresponding second ball-pads; and the plurality of support member pads at the second side includes an array of support member pads arranged in a pattern corresponding at least in part to the arrangement of second ball-pads in the second ball-pad array.

9. The microelectronic device of claim 6, further comprising a plurality of electrical couplers coupled to corresponding support member pads at the second side of the support member.

10. The microelectronic device of claim 1 wherein:

the first redistribution structure includes a plurality of first ball-pads arranged in a first ball-pad array, a plurality of first peripheral contacts at a perimeter portion of the first die, and traces coupling the first terminals to corresponding first ball-pads and/or first peripheral contacts; and the second redistribution structure includes a plurality of second ball-pads arranged in a second ball-pad array, a plurality of second peripheral contacts at a perimeter portion of the second die, and traces coupling the second terminals to corresponding second ball-pads and/or second peripheral contacts, and wherein the plurality of electrical couplers are attached to corresponding second ball-pads.

11. The microelectronic device of claim 10 wherein:

the first ball-pad array is arranged in a first pattern; and the second ball-pad array is arranged in the first pattern.

12. The microelectronic device of claim 10 wherein the electrical couplers attached to corresponding second ball-pads are completely encased in the casing.

13. The microelectronic device of claim 10 wherein at least a portion of the electrical couplers attached to corresponding second ball-pads are at least partially exposed through the casing.

14. The microelectronic device of claim 1 wherein the support member includes an interposer substrate.

15. The microelectronic device of claim 1 wherein the second die is electrically coupled to the support member circuitry without being directly electrically coupled to the first die.

16. The microelectronic device of claim 1, further comprising a third known good microelectronic die attached to the active side of the second die in a stacked configuration, the third die including integrated circuitry and an array of external contacts electrically coupled to the integrated circuitry, wherein the external contacts are adjacent to the second redistribution structure and are electrically coupled to the second redistribution structure.

17. A packaged microelectronic device, comprising:

an interposer substrate including a first side, a second side opposite the first side, a plurality of first interposer contacts and a plurality of second interposer contacts at the first side, and a plurality of interposer pads at the second side;

a first known good microelectronic die attached to the first side of the interposer substrate, the first die including an active side adjacent to the first side of the interposer substrate, a back side opposite the active side, a first terminal at the active side, integrated circuitry electrically coupled to the first terminal, and a first redistribution structure at the active side and electrically coupled to the first terminal and the first interposer contacts;

a second known good microelectronic die attached to the first die in a stacked configuration, the second die including an active side, a back side facing the interposer substrate, a second terminal at the active side, integrated circuitry electrically coupled to the second terminal, a second redistribution structure at the active side of the second die and electrically coupled to the second terminal and the second interposer contacts; and a casing covering the first die, the second die, and at least a portion of the interposer substrate.

18. The microelectronic device of claim 17 wherein:

the first redistribution structure includes a plurality of first ball-pads arranged in a first ball-pad array, a plurality of first peripheral contacts at a perimeter portion of the first die, and traces coupling the first terminals to corresponding first ball-pads and/or first peripheral contacts, wherein the first ball-pads are electrically coupled to corresponding first interposer contacts; and the second redistribution structure includes a plurality of second ball-pads arranged in a second ball-pad array, a plurality of second peripheral contacts at a perimeter portion of the second die, and traces coupling the second terminals to corresponding second ball-pads and/or second peripheral contacts, wherein the second peripheral contacts are wire-bonded to corresponding second interposer contacts.

19. The microelectronic device of claim 18 wherein:
the first ball-pad array is arranged in a first pattern; and
the second ball-pad array is arranged in the first pattern.

20. The microelectronic device of claim 18, further comprising a plurality of electrical couplers attached to corresponding second ball-pads.

21. The microelectronic device of claim 20 wherein the electrical couplers attached to corresponding second ball-pads are completely encased in the casing.

22. The microelectronic device of claim 20 wherein at least a portion of the electrical couplers attached to corresponding second ball-pads are at least partially exposed through the casing.

23. The microelectronic device of claim 17 wherein the plurality of interposer pads at the second side of the interposer substrate includes an array of interposer pads arranged in a pattern corresponding to a JEDEC pinout.

24. The microelectronic device of claim 17, further comprising a plurality of electrical couplers coupled to corresponding interposer pads at the second side of the interposer substrate.

25. The microelectronic device of claim 17 wherein the second die is electrically coupled to the interposer substrate without being directly electrically coupled to the first die.

26. The microelectronic device of claim 17, further comprising a third known good die attached to the active side of the second die in a stacked configuration, the third die including integrated circuitry and an array of external contacts electrically coupled to the integrated circuitry, wherein the external contacts are adjacent to the second redistribution structure and are electrically coupled to the second redistribution structure.

27. A microelectronic device, comprising:
an interposing structure including a first side, a second side opposite the first side, a plurality of first interposer contacts and a plurality of second interposer contacts at the first side, and a plurality of interposer pads at the second side;
a first known good microelectronic die including an active side, a back side opposite the active side, and a first redistribution structure at the active side, wherein the first die is attached and electrically coupled to the interposing structure in a flip-chip configuration;
a second known good microelectronic die having (a) an active side including a second redistribution structure and a plurality of electrical couplers attached to the redistribution structure, and (b) a back side opposite the active side, wherein the back side of the second die is attached to the back side of the first die such that the second redistribution structure is facing away from the interposing structure, and
wherein the second redistribution structure is electrically coupled to the interposing structure, and
an encapsulant at least partially encapsulating the first die, the second die, and at least a portion of the interposing structure.

28. The microelectronic device of claim 27 wherein:
the first die includes integrated circuitry and a first terminal electrically coupled to the integrated circuitry;
the first redistribution structure includes a plurality of first ball-pads arranged in a first ball-pad array, a plurality of first peripheral contacts at a perimeter portion of the first die, and traces electrically coupling the first terminals to corresponding first ball-pads and/or first peripheral contacts, wherein the first ball-pads are electrically coupled to corresponding first interposer contacts;
the second die includes integrated circuitry and a second terminal electrically coupled to the integrated circuitry; and
the second redistribution structure includes a plurality of second ball-pads arranged in a second ball-pad array, a plurality of second peripheral contacts at a perimeter portion of the second die, and traces electrically coupling the second terminals to corresponding second ball-pads and/or second peripheral contacts, wherein the plurality of electrical couplers are attached to corresponding second ball-pads and the second peripheral contacts are wire-bonded to corresponding second interposer contacts.

29. The microelectronic device of claim 28 wherein the electrical couplers attached to corresponding second ball-pads are completely encased in the encapsulant.

30. The microelectronic device of claim 28 wherein at least a portion of the electrical couplers attached to corresponding second ball-pads are at least partially exposed through the encapsulant.

31. The microelectronic device of claim 28 wherein the plurality of interposer pads at the second side of the interposing structure includes an array of interposer pads arranged in a pattern corresponding to a JEDEC pinout.

32. The microelectronic device of claim 28 wherein:
the plurality of interposer pads at the second side of the interposing structure includes an array of interposer pads arranged in a first pattern; and
the second ball-pad array is arranged in a second pattern generally similar to the first pattern.

33. The microelectronic device of claim 28 wherein:
the first ball-pad array is arranged in a first pattern; and
the second ball-pad array is arranged in the first pattern.

34. The microelectronic device of claim 27 wherein the second die is electrically coupled to the interposing structure without being directly electrically coupled to the first die.

35. The microelectronic device of claim 27, further comprising a third known good die physically and electrically coupled to the second redistribution structure on the second die in a stacked configuration, the third die including integrated circuitry and an array of external contacts electrically coupled to the integrated circuitry, wherein the external contacts are adjacent to the second redistribution structure and are electrically coupled to the second redistribution structure.

36. A set of stacked microelectronic devices, comprising:
a first microelectronic device having
a first interposer substrate;
a first known good microelectronic die attached to the first interposer substrate, the first die including an active side and a back side opposite the active side, a first terminal at the active side, integrated circuitry electrically coupled to the first terminal, and a first redistribution structure at the active side of the first die and electrically coupled to the first interposer substrate;
a second known good microelectronic die having an active side including a second redistribution structure and a back side opposite the active side, wherein the back side of the second die is attached to the back side of the first die such that the second redistribution structure is facing away from the first interposer substrate, wherein the second redistribution structure is electrically coupled to the first interposer substrate; and a first casing covering the first die, the second die, and at least a portion of the first interposer substrate; and
a second microelectronic device coupled to the first microelectronic device in a stacked configuration, the second microelectronic device having
a second interposer substrate;
a third known good microelectronic die attached to the second interposer substrate, the third die including an active side and a back side opposite the active side, a third terminal at the active side, integrated circuitry electrically coupled to the third terminal, and a third redistribution structure at the active side of the third die and electrically coupled to the second interposer substrate;
a fourth known good microelectronic die having an active side including a fourth redistribution structure and a back side opposite the active side, wherein the back side of the fourth die is attached to the back side of the third die such that the fourth redistribution structure is facing away from the second interposer substrate, wherein the fourth redistribution structure is electrically coupled to the second interposer substrate; and
a second casing covering the third die, the fourth die, and at least a portion of the second interposer substrate.

37. The stacked microelectronic devices of claim 36 wherein:
the first, second, third, and fourth dies each include integrated circuitry and first, second, third, and fourth terminals, respectively, coupled to the corresponding integrated circuitry, and
the first, second, third, and fourth redistribution structures each include
an array of ball-pads arranged in a ball-pad array;
a plurality of peripheral contacts at a perimeter portion of the corresponding die; and
traces electrically coupling the terminals to corresponding ball-pads and/or peripheral contacts.

38. The stacked microelectronic devices of claim 37, further comprising a plurality of electrical couplers attached to corresponding ball-pads on the redistribution structures.

39. The stacked microelectronic devices of claim 36 wherein the first and second interposing structures each include:
a front side and a back side opposite the front side;
a plurality of first interposer contacts at the front side;
a plurality of second interposer contacts at the front side; and
a plurality of interposer pads at the back side.

40. The stacked microelectronic devices of claim 36, further comprising an underfill material between the first device and the second device.

41. The stacked microelectronic devices of claim 36 wherein the first interposer substrate includes a first side, a second side opposite the first side, a plurality of first interposer contacts and a plurality of second interposer contacts at the first side, and a plurality of interposer pads at the second side, wherein the plurality of interposer pads includes an array of interposer pads arranged in a pattern corresponding to a JEDEC pullout.

* * * * *

UNITED STATES PATENT AND TRADEMARK OFFICE
CERTIFICATE OF CORRECTION

PATENT NO. : 7,485,969 B2 Page 1 of 1
APPLICATION NO. : 11/217749
DATED : February 3, 2009
INVENTOR(S) : Corisis et al.

It is certified that error appears in the above-identified patent and that said Letters Patent is hereby corrected as shown below:

In column 10, line 45, in Claim 3, delete "con tacts." and insert -- contacts. --, therefor.

In column 13, line 54, in Claim 27, delete "structure," and insert -- structure; --, therefor.

In column 16, line 29, in Claim 41, delete "pullout." and insert -- pinout. --, therefor.

Signed and Sealed this

Fifth Day of May, 2009

JOHN DOLL
*Acting Director of the United States Patent and Trademark Office*